United States Patent
Nilsson

(10) Patent No.: US 9,337,793 B2
(45) Date of Patent: May 10, 2016

(54) ORTHOGONAL ERGONOMIC SPEAKER

(71) Applicant: Jack Nilsson, Canton, OH (US)

(72) Inventor: Jack Nilsson, Canton, OH (US)

(73) Assignee: Jack Nilsson, Medina, OH (US)

(*) Notice: Subject to any disclaimer, the term of this patent is extended or adjusted under 35 U.S.C. 154(b) by 412 days.

(21) Appl. No.: 13/743,656

(22) Filed: Jan. 17, 2013

(65) Prior Publication Data

US 2013/0182869 A1    Jul. 18, 2013

Related U.S. Application Data

(60) Provisional application No. 61/632,014, filed on Jan. 17, 2012.

(51) Int. Cl.
| | |
|---|---|
| *H03G 5/00* | (2006.01) |
| *H03G 3/20* | (2006.01) |
| *H04R 5/02* | (2006.01) |
| *H04R 3/14* | (2006.01) |
| *H04R 27/00* | (2006.01) |

(52) U.S. Cl.
CPC .. *H03G 3/20* (2013.01); *H04R 5/02* (2013.01); *H04R 3/14* (2013.01); *H04R 27/00* (2013.01)

(58) Field of Classification Search
CPC .............. H04R 1/26; H04R 3/14; H04R 3/04; H04R 5/02; H04R 1/24; H04R 2201/403; H04R 1/227; H04R 1/30; H04R 17/00; H04R 1/2811; H04R 1/2857; H04R 1/288; H04R 1/34; H04R 1/345; H04R 1/42; H04R 2205/022; H04R 2499/13; H04R 27/00; H04R 29/001; H04R 19/02; H04R 3/00
USPC ................ 381/300, 59, 89, 332, 99, 116, 117
See application file for complete search history.

(56) References Cited

U.S. PATENT DOCUMENTS

| | | | |
|---|---|---|---|
| 6,496,152 B2 | 12/2002 | Nilsson | |
| 6,806,841 B2 | 10/2004 | Nilsson et al. | |
| 6,834,113 B1* | 12/2004 | Liljehag | H04R 5/02 181/144 |
| 7,030,831 B2 | 4/2006 | Nilsson | |
| 7,138,956 B2 | 11/2006 | Nilsson | |
| 7,236,129 B2 | 6/2007 | Nilsson | |
| 7,348,933 B2 | 3/2008 | Nilsson | |
| D623,633 S | 9/2010 | Bliss et al. | |
| 7,791,555 B2 | 9/2010 | Nilsson | |
| D634,308 S | 3/2011 | Bliss et al. | |
| 7,916,097 B2 | 3/2011 | Nilsson | |
| D659,127 S | 5/2012 | Bliss et al. | |
| 2002/0141605 A1* | 10/2002 | Murata | H04R 1/26 381/111 |
| 2007/0286427 A1* | 12/2007 | Jung | H04S 3/002 381/17 |
| 2009/0052676 A1* | 2/2009 | Reams | H04S 5/00 381/1 |
| 2009/0290724 A1* | 11/2009 | Corynen | H04R 1/26 381/99 |
| 2013/0236031 A1* | 9/2013 | Risberg | H04R 1/24 381/98 |

* cited by examiner

*Primary Examiner* — Akelaw Teshale
(74) *Attorney, Agent, or Firm* — Eschweiler & Associates, LLC

(57) ABSTRACT

A system and method for an audio system with two or more speakers, drivers, sources and the like is presented. An audio system includes a first speaker that reproduces sounds in a first frequency range and a second speaker that reproduces sounds in second frequency range. A crossover frequency is formed between the first frequency range and the second frequency range. The first speaker and the second speaker are physically separated by more than one wavelength of the crossover frequency and the first speaker is arranged horizontal with respect to the second speaker.

18 Claims, 10 Drawing Sheets

| D | CROSSOVER FREQUENCY | λ | $F = \dfrac{2D^2}{\lambda}$ | # of lobes $= 2\dfrac{D}{\lambda}+1$ | a | $X = F \sin a$ |
|---|---|---|---|---|---|---|
| 21" | 4500 Hz | 3" | 24.5' | 15 | 5.5° | 28.2" |
| 36" | 5625 Hz | 2.4" | 90' | 31 | 2° | 37.7" |

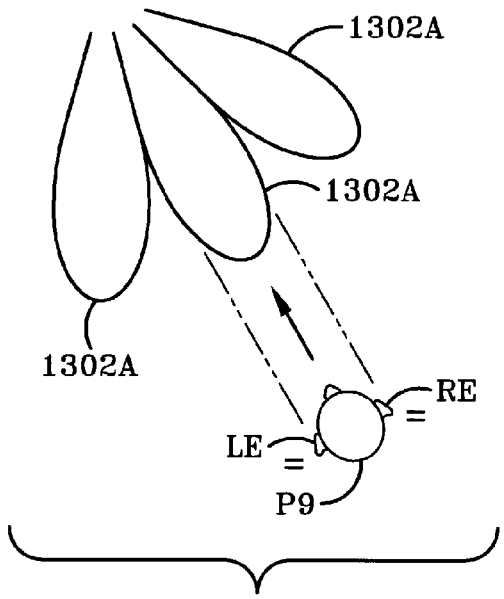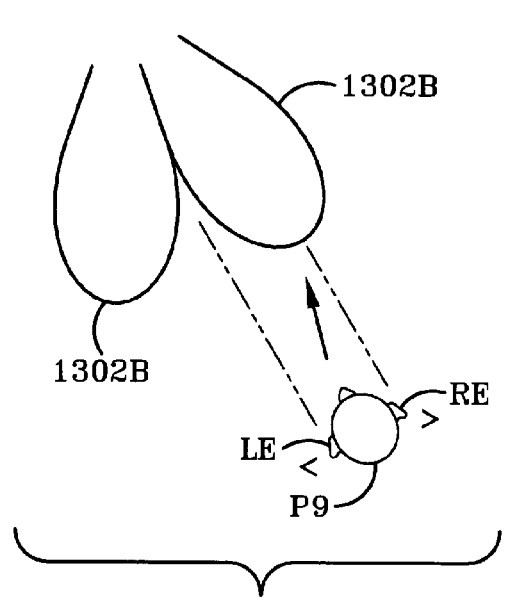
FIG-13A  FIG-13B
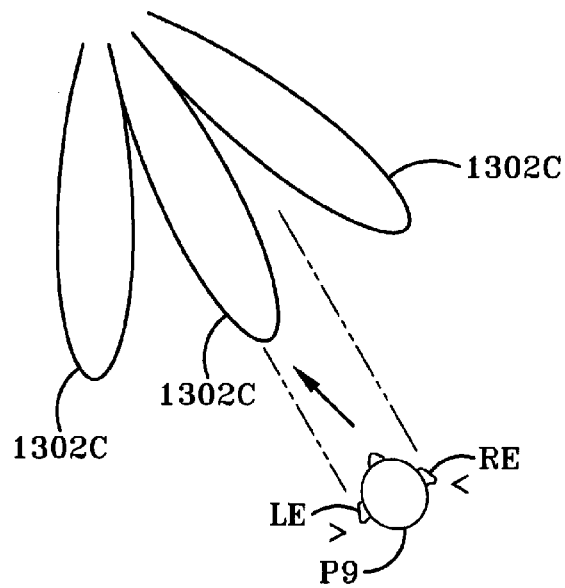
FIG-13C

=8" (assuming with speed of sound at ground level … =1126 feet per second). A Tweeter T is positioned above a Woofer W and they are positioned one crossover wavelength (8 inches) apart center-to-center. A first waveform WF1 is shown emitted from the Tweeter T along a first waveform axis WFA1 and a second waveform WF2 is shown emitted from the Woofer W along a second waveform axis WFA2 that is parallel to the first waveform axis WFA1.

The right triangle formed by points P1, P2 and P3 is used to determine the cancellation axis. It is known that the cosine of angle "a" is the cosine of the line segment formed by points P2/P3 divided by the line segment formed by points P1/P2. Line segment P1/P2 is 8 inches (T & W separation). Waveform WF1 from the Tweeter T and the second waveform WF2 from the Woofer W are simultaneously both at peak values at points P2 and P1 respectively. When the first waveform WF1 and the second waveform WF2 cross line segment P1/P3 they are ½λ out-of-phase. Because the two waveforms are ½λ out-of-phase when crossing segment P1/P3, P2/P3 is 4 inches. Therefore angle "a"=cosine ((segment P2/P3)/(segment P1/P2))=cosine (4 inches/8 inches)=60° and the "angle of cancelation" is 90–60°=30° and in FIG. 1 points in the direction of line CA that is parallel to the first waveform axis WFA1 and the second waveform axis WFA2.

As illustrated in prior art FIGS. 2 and 3, even if the woofer W and tweeter T individually produce a rather broad sound field pattern, their sound fields interact at and around the crossover frequency point (where both drivers are producing sound) forming elevation pattern nulls. The only resultant broad sound fields are horizontal in pattern and only in the lobes LBs. FIG. 2 is a prior art example partial elevation view of a first person FP located in a lower location than a second person SP in an elevated location in a theater. This FIG. 2 illustrates how the lobes LBs form cancelation axes in a vertical plain. This figure illustrates a first person P1 is in a first cancellation axis CA1 so that his audio level/quality is poor and the second person P2 in a second cancellation axis CA2 so that his audio level/quality is also poor. FIG. 3 illustrates how the lobes LBs form cancelation axes in a horizontal pine if the prior art speaker is placed sideways. This figure illustrates a third person P3 is in a third cancellation axis CA3 so that his audio level/quality is poor and the fourth person P4 in a fourth cancellation axis CA4 so that his audio level/quality is also poor.

ORTHOGONAL ERGONOMIC SPEAKER

CROSS REFERENCE TO RELATED APPLICATION

This application claims priority from U.S. Provisional Application Ser. No. 61/632,014 filed Jan. 17, 2012; the disclosure of which is incorporated herein by reference.

BACKGROUND OF THE INVENTION

1. Field of Invention

The current invention relates generally to apparatus, systems and methods for generating sound. More particularly, the apparatus, systems and methods relate to placing two separate drivers a certain number of crossover frequency wavelengths apart. Specifically, the apparatus, systems and methods provide for a tweeter driver and a woofer driver side-by-side to produce a broad field of sound, left-to-right and up-and-down particularly at the crossover frequency.

2. Description of Related Art

For eons people have enjoyed good feelings that can come from good sound such as music. There are mental associations with music and sounds such emotional responses to life events such as love and losses, great pursuits, and simpler times associated with different sounds. As a result of listening to quality sounds biochemical changes in the brain can occur, resulting in the elevation in levels of endorphins and enkephalins to enhance the experience of listing to those sounds.

Because of the great enjoyment people associate with music and other sounds, extensive efforts over time have been made to improve sound production and reproduction. One key element of sound reproduction is the speaker. An important goal in reproducing sound is to produce proper balance of lower (bass), mid, and upper (treble) audio frequencies. Drivers such as woofers, midrange drivers, and tweeters are commonly used to reproduce sounds. Additionally crossover networks, both passive and active, can be used with the intent to produce the same magnitude of sound (SPL=Sound Pressure Level, such as measured at one meter with one watt drive) across the audio spectrum (e.g. 20 Hz-20 KHz), while maintaining balance of impedances and phasing as best as possible, and reducing power loads on devices such as the tweeter.

Unfortunately, due to how sounds travel on electromagnetic waveforms the listening area has nulls (as well as peaks), sometimes dramatic, at/near the crossover point(s) frequency(s). The sound at the crossover frequency is not evenly distributed to the audience on the up and down elevation patterns and/or the left & right azimuth audio signal patterns and the audience can hear these defects. Additionally, these sound field inconsistencies can also occur at frequencies other than at the crossover point. Audiences are delighted in their musical experience when the problem is mitigated or resolved.

It is unfortunate that the prior art method(s) for mitigating this otherwise highly inconsistent sound distribution was to use many drivers in a tall vertical array (long horizontal array in larger auditoriums, etc.), or using long ribbon, planer and similar drivers. These improvements are all quite large and expensive, and still have focused pattern and imaging problems at times. Digital Signal Processing (DSP) solutions require circuitry and multiple drivers and are therefore also very expensive.

FIG. 1 illustrates the well know prior art of how to determine the angle of a cancelation axis. In this example, the crossover frequency is 1700 Hz with a wavelength of about FIG. 4 illustrates a prior art system that corrects for cancelation axes by using a passive line array 400 with multiple ribbon/planar/waveguide coherent wave drivers 410. This system is rather large and very costly so it is not practical in many situations. It is similar to long ribbon and planar speakers that are also large and very expensive. However, when they are employed they can produce rather straight wave fronts 420 with reduced cancellation axes resulting in a good audio reception at a fifth person P5 that is positioned within the range of this line array 400. However, one needs to be substantially directly in the line of broadcast of this system; if one is above or below (or often, also off to one side of the wave front) the audio is reduced, quality is poor.

Another prior art system uses a line array of "spherical wave" non-coherent drivers. The result is a less acutely lobular pattern than such as FIG. 2. Undesirably, this approach is also expensive and rather large; it is often not practical to use this approach.

FIG. 5 illustrates a variant of line array 400 of FIG. 4 placed with drivers physically moved into a curved formation. Similar to the passive line array 400 of FIG. 4, it produces fairly uniform waveforms 520 with reduced cancellation axes but here with somewhat broader sound pattern forward of the inter-driver axis. However, these systems are rather large and are very expensive.

Therefore what is needed is a less costly, smaller, and better solution of reproducing consistent (sensed) sound field level/quality audio sound.

SUMMARY

The preferred embodiment of the invention includes an audio system with a first speaker that reproduces sounds in a first frequency range and a second speaker that reproduces sounds in second frequency range. A crossover frequency is formed by the first frequency range and the second frequency range. The first speaker and the second speaker are physically separated by more than one wavelength of the crossover frequency and the first speaker is arranged horizontal with respect to the second speaker. The first speaker can be a woofer speaker and the second speaker can be a tweeter speaker.

In other configurations of the preferred embodiment of the audio system the first speaker and the second speaker are separated by more than two wavelengths of the crossover frequency, three wavelengths of the crossover frequency or a greater number of wavelengths of the crossover frequency.

In another configuration of the preferred embodiment, first speaker and the second speaker generate more than seven far field lobes.

These embodiments would generate enough lobes so that an ear of an adult person is always within one of the far field lobes when the person is within the far field of the audio system.

Another configuration of the preferred embodiment is a sound system with a first sound source driver and a second sound source driver. There is a crossover frequency with a value output by both the first sound source driver and the second sound source driver. The first sound source driver and the second sound source driver are located greater than one wavelength value apart.

In another configuration of this embodiment, the first sound source driver and the second sound source driver are located more than two, three or a greater number of wavelength values apart. The first sound source driver and the second sound source driver are horizontally spaced with respect to each other. The first sound source driver can be a woofer speaker driver and the second sound source driver can be a tweeter speaker driver.

Another configuration of the preferred embodiment is a method of locating speaker drivers and building a speaker system. The method begins by selecting a crossover frequency of a first speaker driver and a second speaker driver. Next, a separation distance (D) between the first speaker driver and the second speaker driver is selected. Next, a distance between two adjacent cancellation axes that are between adjacent lobes is determined as a distance 2X. A determination is then made to determine if (2X)/10 is less than or about the distance between the two ears of an average person. [This is known as the "~$\frac{1}{10}$ rule" as discussed in detail below.] A determination is made to determine whether to build the speaker system based, at least in part, on the size of the room/venue as the intended use. If the speaker system is to be built, then the method builds the speaker system. The speaker system is built with the crossover frequency and so that the first speaker driver and the second speaker driver are separated by the separation distance.

BRIEF DESCRIPTION OF SEVERAL VIEWS OF THE DRAWINGS

One or more preferred embodiments that illustrate the best mode(s) are set forth in the drawings and in the following description. The appended claims particularly and distinctly point out and set forth the invention.

The accompanying drawings, which are incorporated in and constitute a part of the specification, illustrate various example methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

FIGS. 13A-C illustrate how multiple lobes change at, below, and above the crossover frequency creating life-like "sound-in-motion" which is a dynamic effect provided by the preferred embodiment particularly in the far field.

Similar numbers refer to similar parts throughout the drawings.

DETAILED DESCRIPTION

Figure 1:
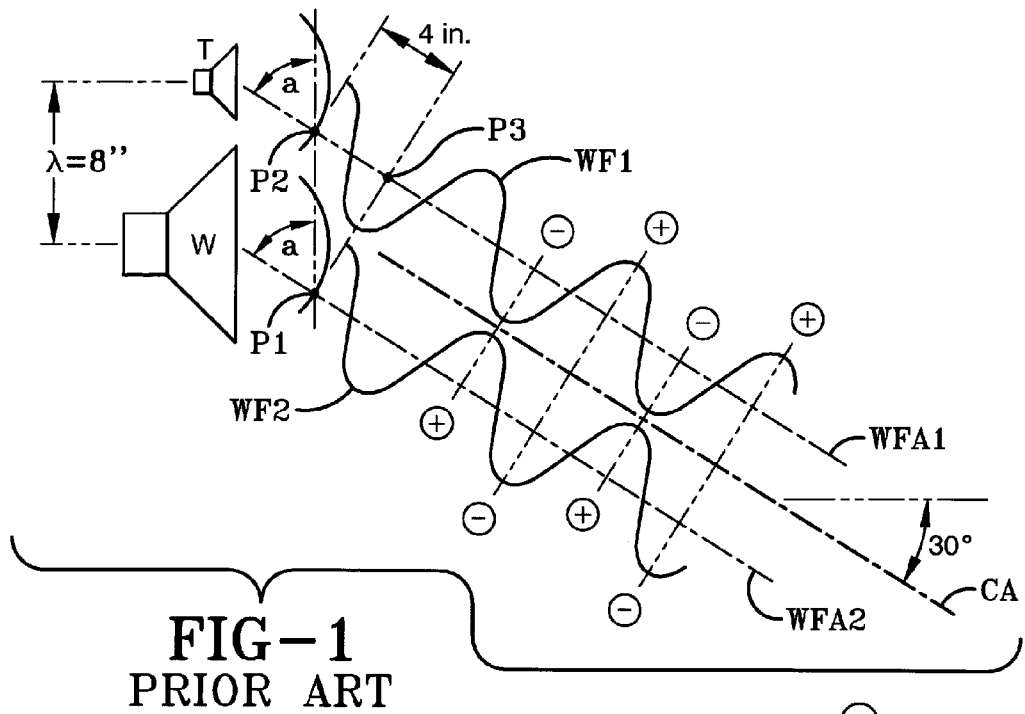
FIG. 1 is a prior art illustration of a well-known way determining the angle of a cancelation axis.
Figure 2:
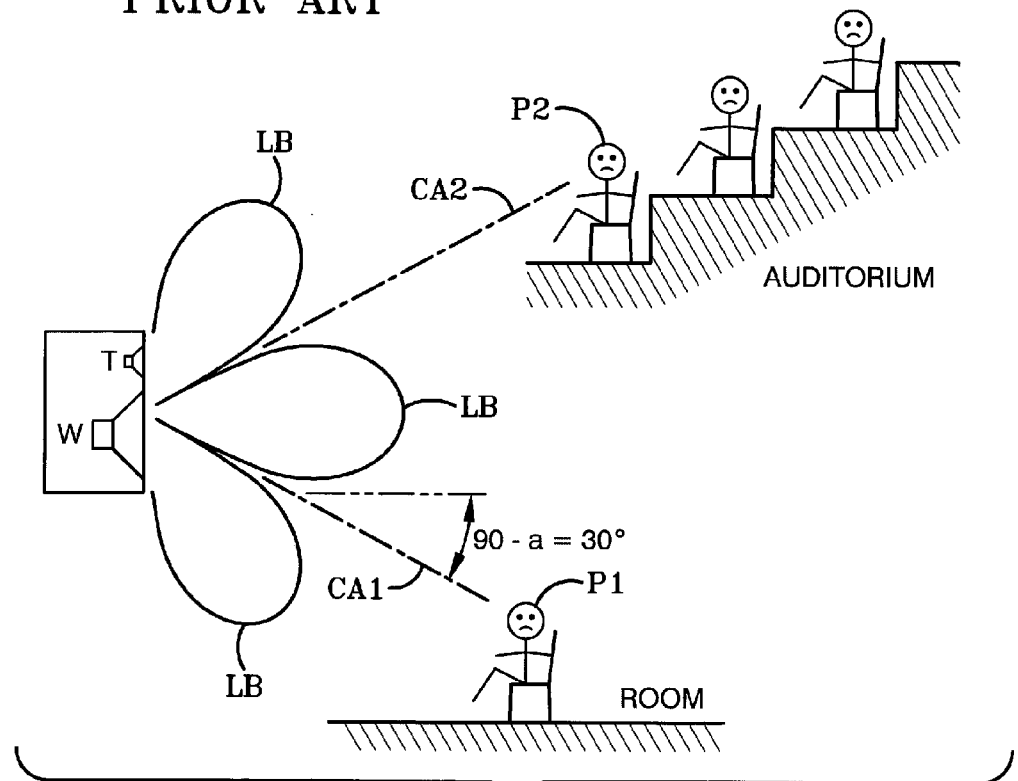
FIG. 2 is a prior art illustration of the side view of two cancelation axes.
Figure 3:
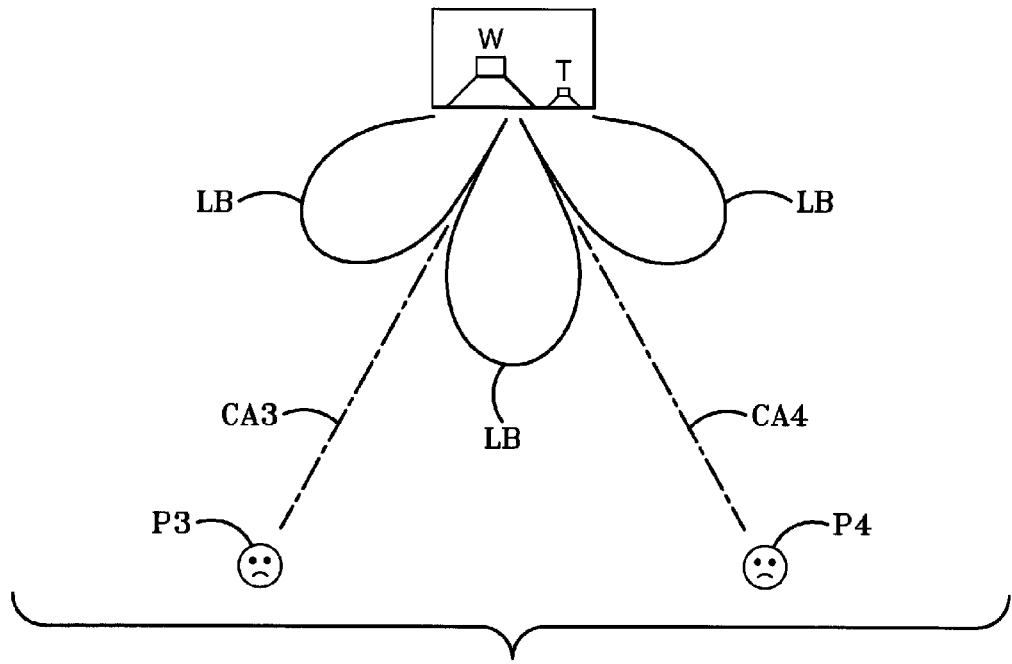
FIG. 3 is a prior art illustration of the top view of two cancelation axes.
Figure 4:
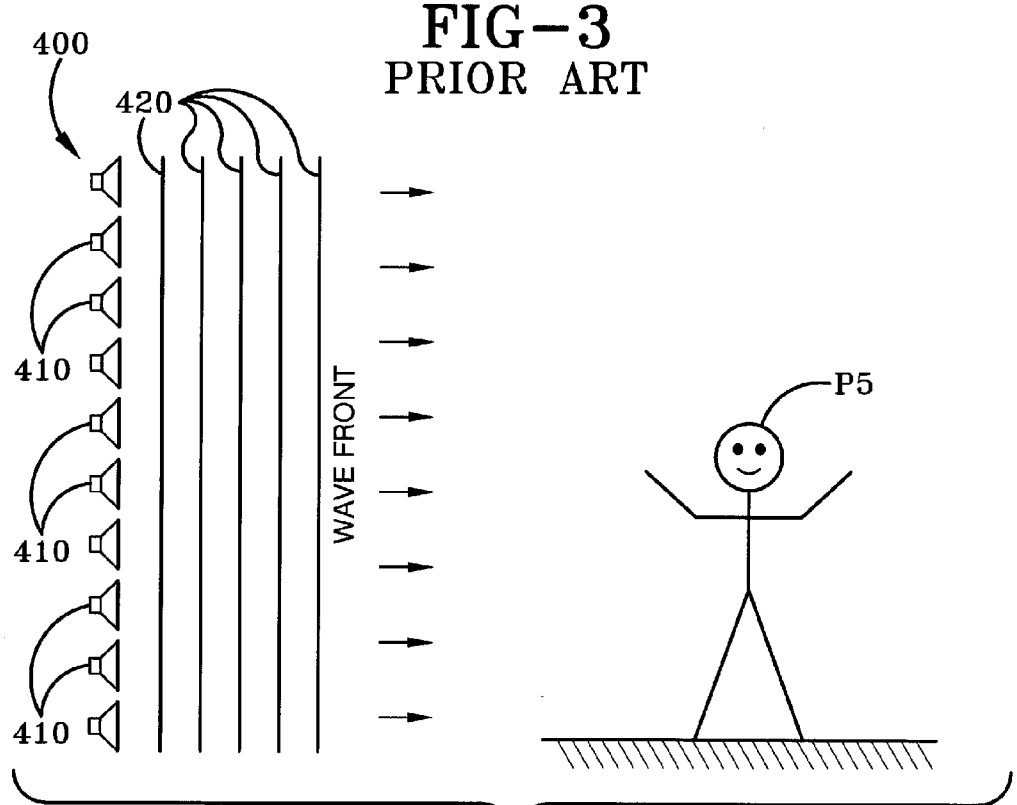
FIG. 4 is prior art illustration of system that corrects for cancellation axes by using a (passive) line array with multiple drivers.
Figure 5:
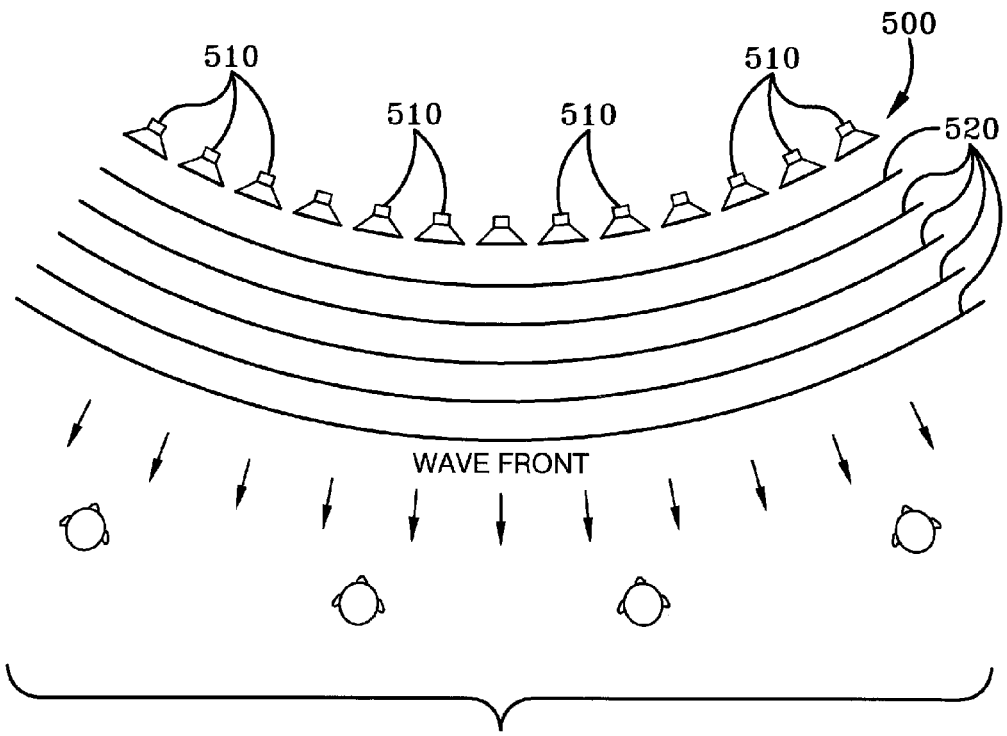
FIG. 5 is a prior art illustration of multiple curved arrangement coherent drivers.
Figure 6:
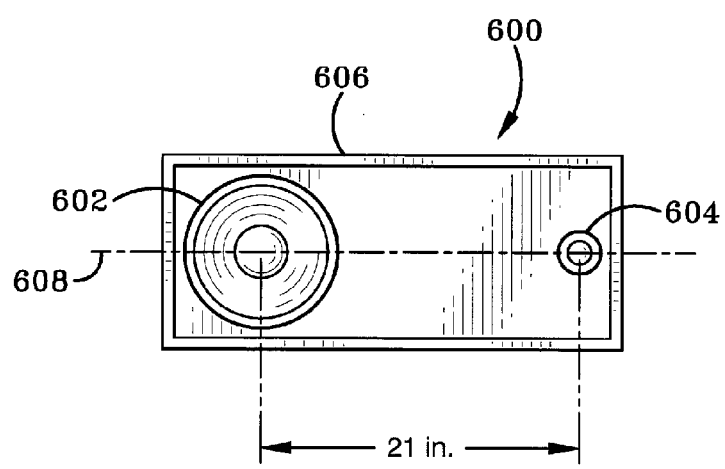
FIG. 6 illustrates the preferred embodiment of an orthogonal ergonomic speaker system.

The problem (and solution herein) applies to both passive and active crossover network speaker systems. This solution also incorporates benefits of the physics of dual/multi-source wave summation patterns and the human form. FIG. 6 illustrates the preferred embodiment of an orthogonal ergonomic speaker system 600. In the preferred embodiment, the speaker system 600 includes a first speaker driver 602 and a second speaker driver 604. In the preferred embodiment, the first speaker driver 602 is a woofer speaker driver and a second speaker driver 604 is a tweeter speaker driver. However, in other embodiments, different kinds of speakers can be used. In some configurations of the preferred embodiment the speaker drivers 602, 604 can be mounted in a housing 606 as illustrated or they can be mounted in separate housings. The speaker system 600 of FIG. 6 is physically much smaller and a lower priced solution compared to prior art solutions and it incorporates the physics of wave interactions & of human anatomy and physiology with ears horizontally separated. The preferred embodiment speaker system 600 achieves the goal of greater uniformity in the sound field.

The preferred embodiment speaker system 600 rotates the inter-driver axis orthogonally, and separates the two drivers 602, 604 by greater than one crossover frequency wavelength. This separation can be more for larger rooms and this solution has considerably smaller speaker dimensions than prior art solutions and requires lesser number of drivers. Two drivers 602, 604 are often horizontally (orthogonally) separated by more than two wavelengths. Prior art systems placed tweeter and woofer drivers as close together as possible; therefore, the preferred embodiment speaker system 600 is novel in intentionally separating them by (much) more than one crossover frequency wavelength. It is orthogonal because the drivers 602, 604 are separated from each and because they are horizontally arranged rather than vertically as in prior art systems.

Figure 8:
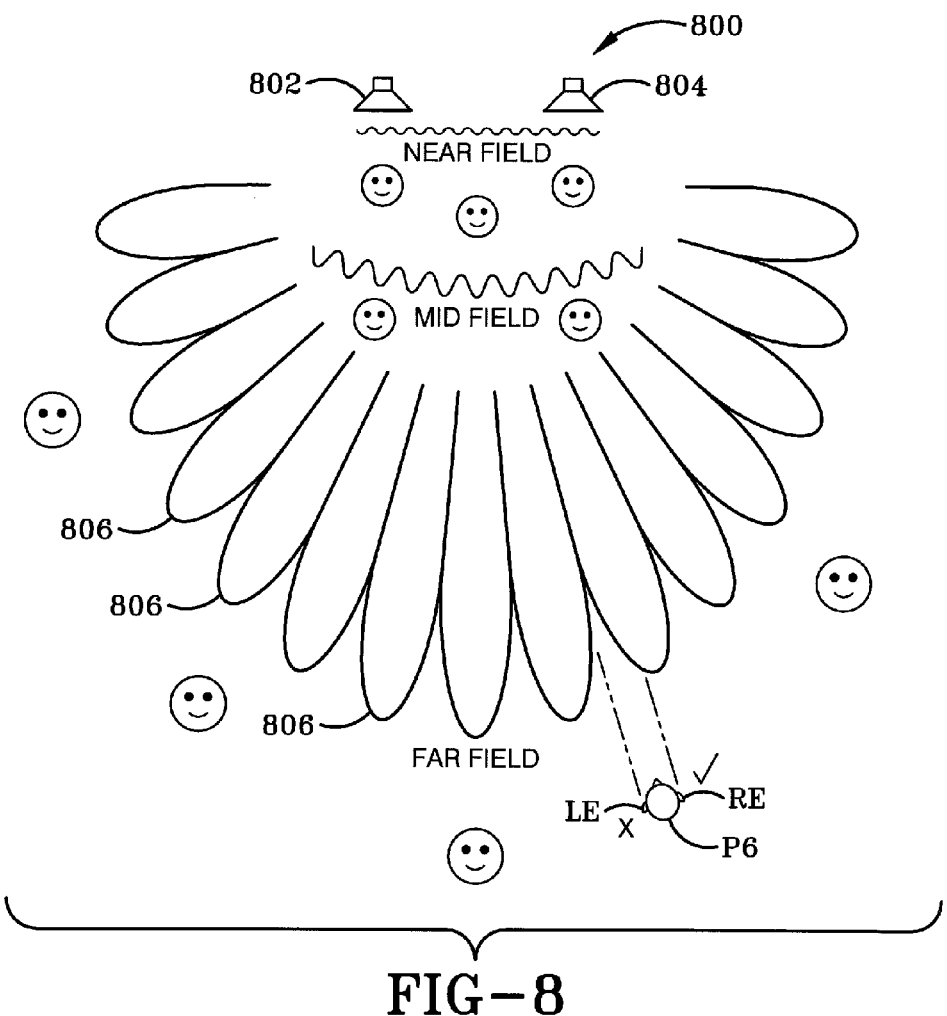
FIG. 8 illustrates substantial uniformity in sensed audio levels (at least for one ear) in the far filed as well as rather level (spot) (each ear) consistency in near and mid field audio of the preferred embodiment of the orthogonal ergonomic speaker system.

This system not only provides reasonably uniform near and mid field audio as shown in FIG. 8 (even with single point measurement such as a microphone pickup for sound pressure intensity/audio spectrum analysis) but the resultant multi-lobed 806 far-field pattern becomes effective. In FIG. 8, those of ordinary skill in the art will understand that the near field extends from the speak system 800 outward to:

$$0.62\sqrt{\frac{D^3}{\lambda}},$$

the far field begins at:

$$\frac{2D^2}{\lambda}$$

and the middle field includes everything else between these two ranges.

Figure 7:
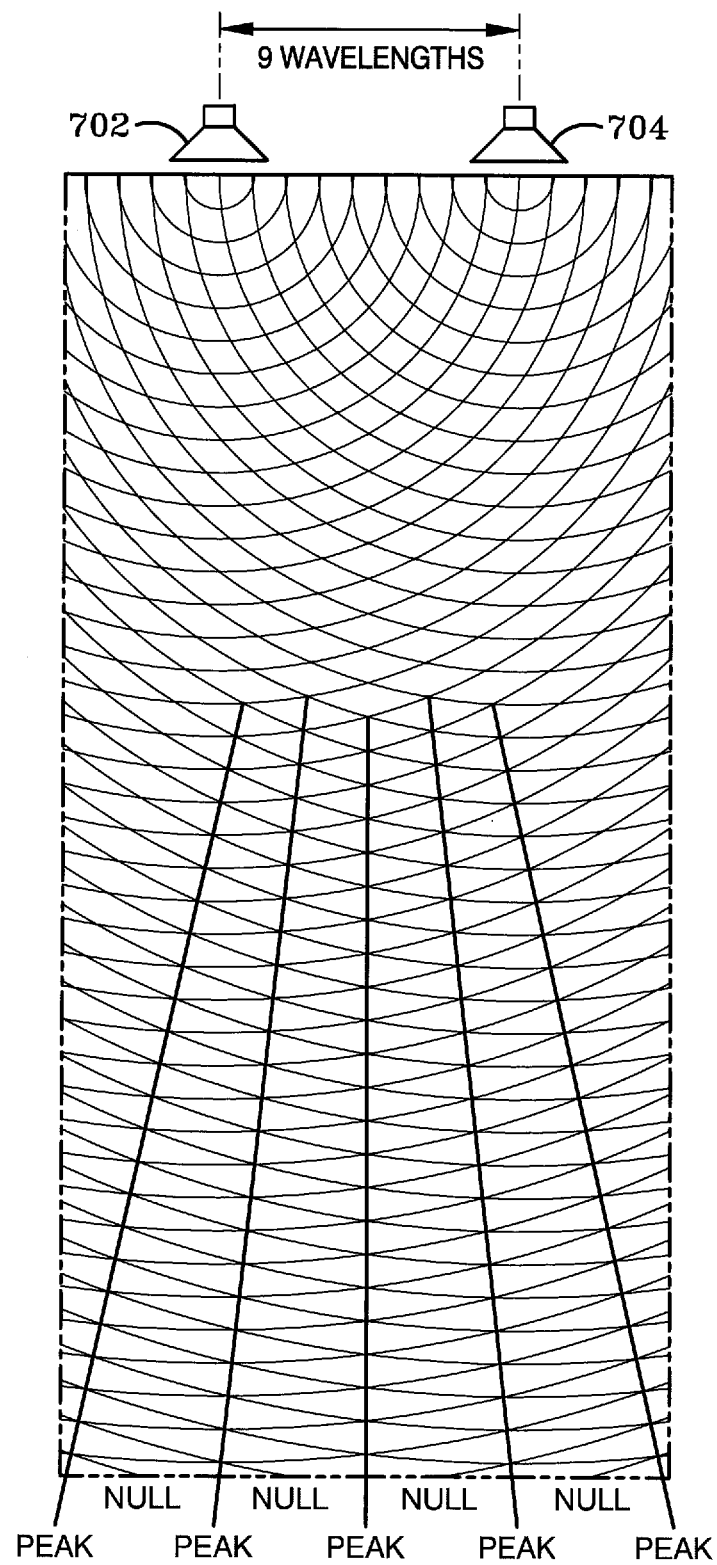
FIG. 7 illustrates two sources separated by 9 wavelengths with their associated peaks and nulls.

In the preferred embodiment of the invention, nulls (as best seen in FIG. 7) are compensated by the fact that the multi-lobed pattern of the lobes are azimuth in shape. The two sources shown in FIG. 7 are separated by 9 wavelengths. Having a multi-lobed pattern of the lobes generally shaped as an azimuth means, as described in detail later, that when one ear is in a lesser sound level zone, the other ear is in a greater sound level zone. Therefore, in even larger spaces such as an auditorium, theater and the like the audio is not completely lost at any place and there may even be good audio in far field locations. The preferred embodiment of the invention provides for greater uniformity in the (sensed) sound field.

FIG. 8 illustrates the configuration of the preferred embodiment implemented as a sound system 800 with a first speaker driver 802 and a second speaker 804. The two non-coherent sources 802, 804 are separated by 7 wavelengths at the crossover frequency resulting in 15 lobes 806 at that frequency. At higher frequencies ($\lambda$ decreases) there are greater numbers of lobes. The number of lobes=$2D/\lambda+1$. So where D (the separation between the two drivers 802, 804) increases, so also does the number of lobes. The beginning of the far field (F) increases proportionately with the increase in the frequency, and by the square of the distance (D) between the two drivers ($2D^2/\lambda$).

Before beginning a more detailed discussion of the preferred embodiment, the preferred embodiment as best seen in FIGS. 6 and 8 can be described turning the driver-driver axis 608 orthogonally where the field strength variations in the far field are now multi-lobed. As described in detail below, this results in that when one receives mitigated audio because one is in a cancellation axis the other ear still has substantial Sound Pressure Level (SPL). In the preferred embodiment, this occurs at every elevation degree because there is similarity in azimuth pattern forms at all elevations. Also, the higher and lower portions of the side-by-side fin-style lobes 806 (FIG. 8) have reasonable sound levels with the drivers 802, 804 being individually substantially broad in pattern. Therefore, not only is there uniformity (for both left and right ears of a person) in actual spot SPL's in the near field, there is sensed substantial uniformity in all fields, near, mid, and much of the far field in all directions. This approach (also) provides for excellent acoustic imaging results.

Figures 9A, 9B:
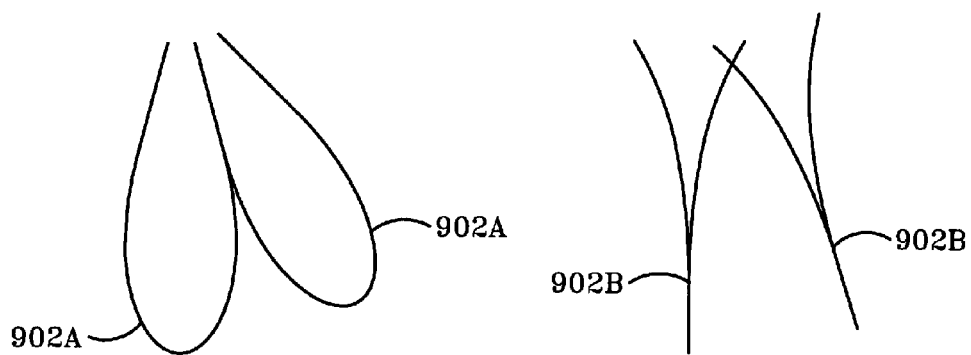
FIGS. 9A and 9B illustrate that the general shapes of the lobes of the preferred embodiment and lobe shape not produced by the preferred embodiment.

FIG. 9A illustrates the general shapes of the lobes of the preferred embodiment. The preferred embodiment has convexly shaped lobes 902A as generally illustrated in example FIG. 9A not concavely shaped lobes 902B as generally illustrated in example FIG. 9B.

Figure 10:
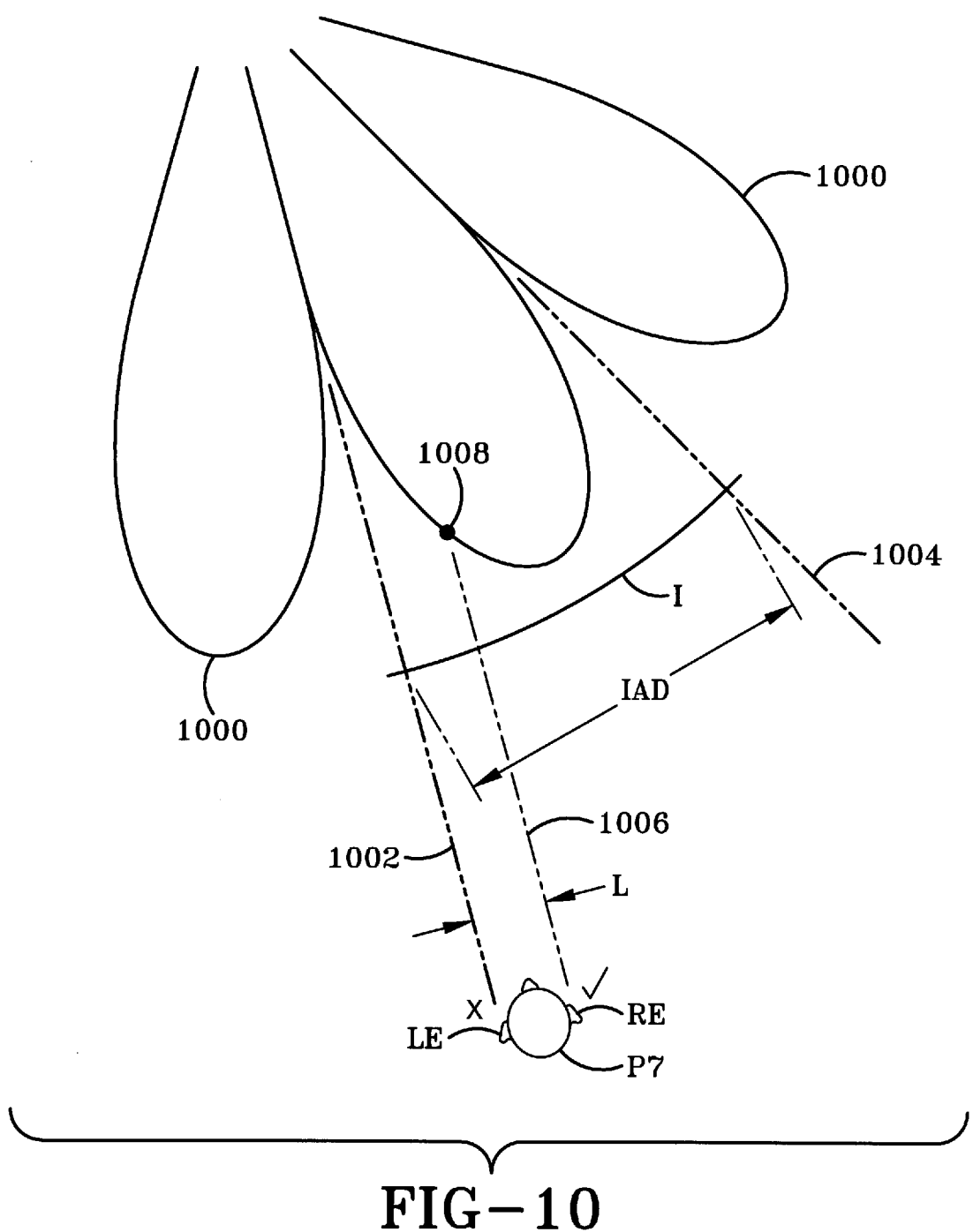
FIG. 10 illustrates that even if the left ear of person is positioned precisely on a cancellation axis between two lobes that then the other right ear is still within a lobe of the preferred embodiment.

FIG. 10 illustrates that even if the left ear LE of person P7 is positioned precisely on a cancellation axis 1002 between two lobes 1000, then the right ear RE needs to be only about ~1/10 of the way toward the next cancellation axis 1004 (or greater) for it to be in a significantly higher SPL area. As one of ordinary skill in this art would appreciate, person P7 is shown rearward of the lobes 1000 for clarity, in practice the person's right ear RE would be forward and in the center lobe near where line 1006 enters that lobe. This phenomenon is known as the "~1/10 rule" that supposes that when one ear or is in a cancellation axis the other ear only needs to be within about 1/10 the inter axis distance IAD as measured between the two cancellation axes 1002, 1004. Here, the right ear RE would receive adequate audio sound because it is in-line with line 1006 that passes through point 1008 and far enough away from the left cancellation axis 1002 ensuring that at least the right ear RE receives adequate audio level. After describing further characteristics and another configuration of the preferred embodiment, the "~1/10 rule" will be further described below with respect to a methodology of determining suitable crossover frequencies and inter-driver spacing to satisfy the "~1/10 rule".

Figure 11:
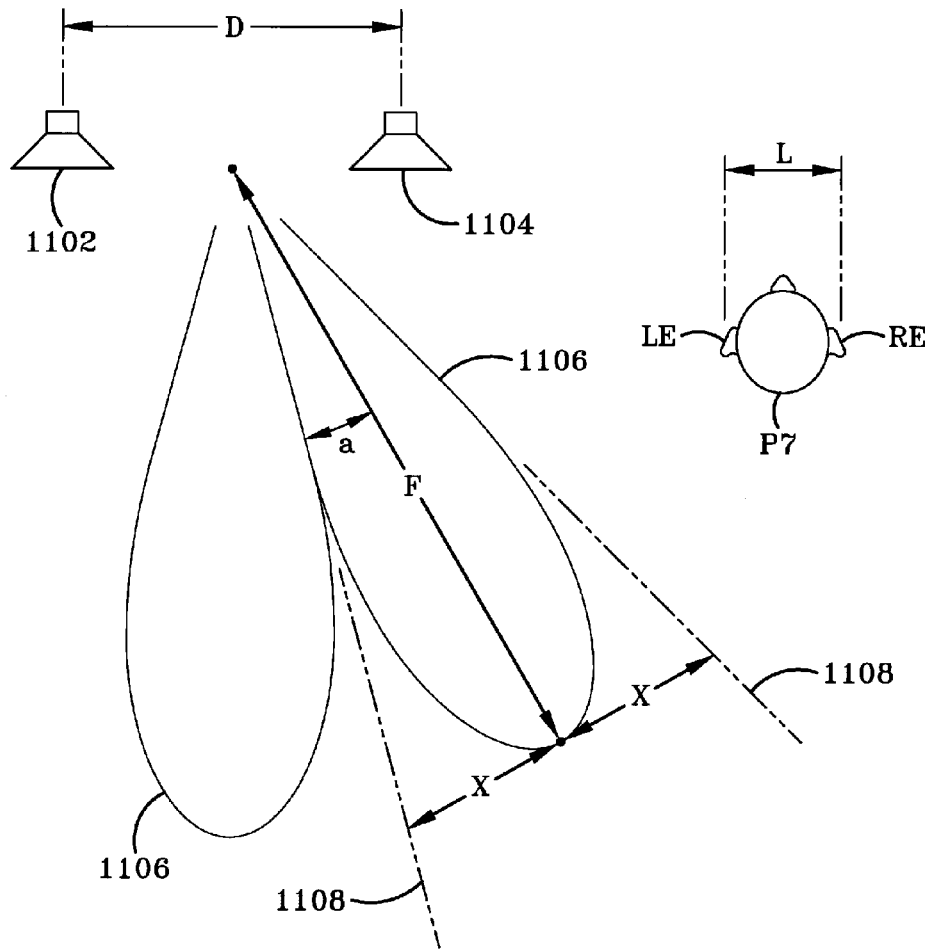
FIG. 11 illustrates the preferred embodiment as a method of selecting suitable crossover frequencies and inter-driver spacing to satisfy the "~$\frac{1}{10}$ rule".

FIG. 11 is best described with reference to a methodology so the description of FIG. 11 will be presented later after further describing the preferred embodiment and its characteristics.

Figures 12A, 12B:
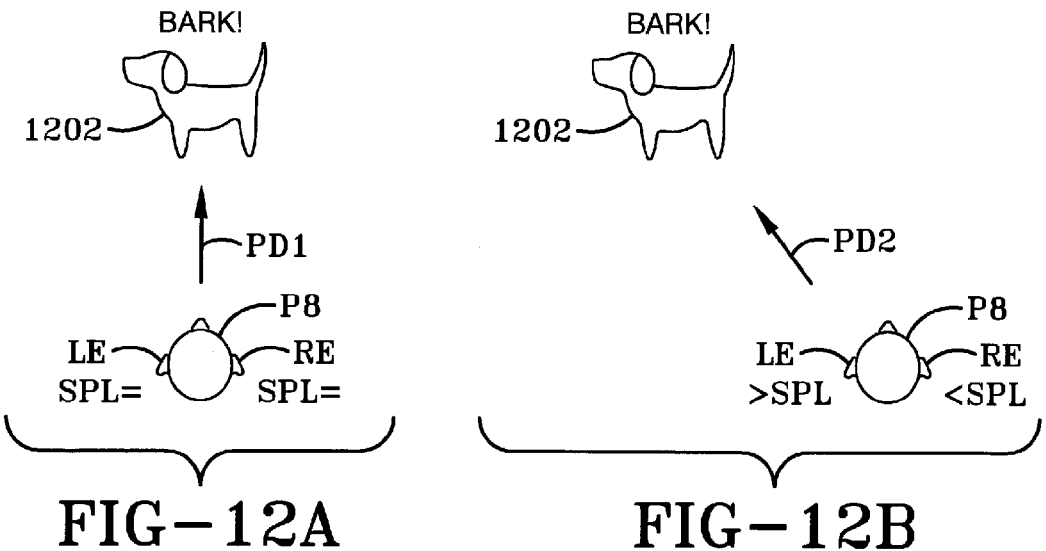
FIGS. 12A-B illustrates basic direction recognition mechanism of the g-eared human.

Another benefit of the preferred embodiment of FIGS. 7 & 8 is that it provides for multi-lobe pattern shifts to the left & right ("to-and-fro") with audio content. The multiple lobes change in number and shift at, below, and above the crossover frequency creating "sound-in-motion" which is a life-like dynamic effect Illustrated in FIGS. 13A-C. For example, as the music source changes from one string to another on the musical instrument or from one instrument or vocalist to another of different frequency, source sensed position actually shifts. As the frequency is changed, the multi-lobe speaker pattern likewise shifts. As there is with live stage directional change of varied sound sources, there is motion of sound from the orthogonal ergonomic speaker systems 600, 800 of FIGS. 6 and 8. The essentials of human dual-ear direction recognition is illustrated in FIG. 12A with illustrating a person P8 listening to a dog 1202 "bark". If the dog is directly in front of and between both the person's ears, then the SPL on the left ear will be the same as the SPL on the right ear and the person P8 will perceive the dog 1202 as being directly in front of that person P8 even if that person P8 cannot see the dog 1202 in the dark. As shown in FIG. 12B, if the dog 1202 is to the left of the person's ears then the SPL on the left ear will be greater than the SPL on the right ear and the person will perceive the dog as being to the left of that person P8 even if that person P8 cannot see the dog 1202. The design of the preferred embodiment speaker systems 600, 800 reproduces these effects due to the changing multiple lobes they generate.

When the frequency decreases, $\lambda$ increases and the number of lobes decreases and when the frequency increases, $\lambda$ decreases and the number of lobes increases. Again, the number of lobes=$2D/\lambda+1$. FIGS. 13A-C illustrates this for various frequencies. The person P9 is stationary in all three of these figures, however the lobes 1302A-C change numbers and position. For example, for a 4 KHz frequency illustrated in FIG. 13A, the SPL is the same on both of the person's ears because a lobe 1302A is centered about his ears so that he perceives this sound as coming directly at him. For a 3 KHz frequency illustrated in FIG. 13B, the SPL is smaller on his left ear than on his right ear because a cancellation axis is near his left ear so that he perceives this sound as coming from his right side. For a 5 KHz frequency illustrated in FIG. 13C, the SPL is greater on his left ear than on his right ear because a cancellation axis is near his right ear so that he perceives this sound as coming from his left side.

Figure 14:
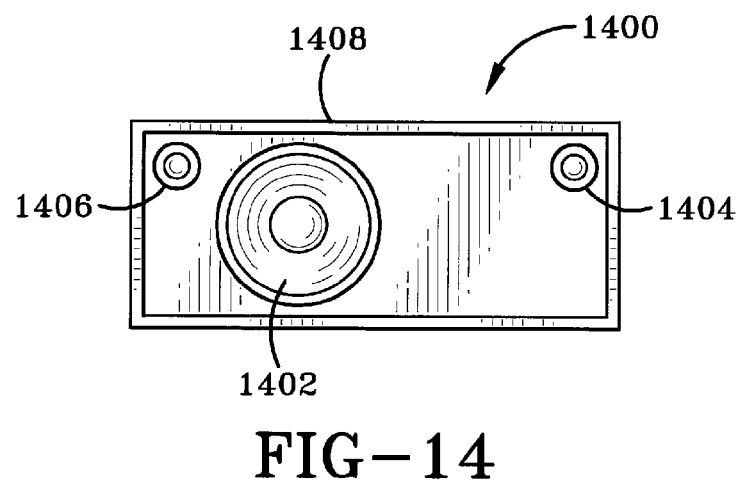
FIG. 14 illustrates a second embodiment of an audio system with three drivers.

Another configuration of the preferred embodiment is illustrated in FIG. 14. This speaker system 1400 includes a first speaker driver 1402 and a second speaker driver 1404 similar to the speaker system 600 of FIG. 6. However, this speaker system 1400 further enhances the life-like dynamic sound stage by adding an additional speaker driver 1406. This allows the dynamic music effects discussed above to occur not only with musical content changes near the crossover frequency but also at many frequencies above the crossover frequency. The speaker drivers 1402, 1404, 1406 can be mounted in a housing 1408.

Having described the components and the characteristics of the invention example methods of the invention will now be described. The example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

FIG. 11 is useful to illustrate a method of selecting suitable crossover frequencies and inter-driver spacing to satisfy the "~1/10 rule" discussed above. The inter-driver spacing is first selected and is the distance D between a first speaker driver 1102 and a second speaker driver 1104. In operation, the speaker drivers 1102, 1104 create acoustic lobes 1106 as discussed above. For clarity, only a couple of lobes 1106 are illustrated. A cancellation axis 1108 is formed between the lobes 1106. A distance "L" is the distance between the two ears of a person P7 and that distance has been determined to be a constant of 7 inches (7"). A distance F is the distance from between the speaker drivers where the far field begins shown here at an outward edge of a lobe. A distance X is a distance perpendicular and from line F to the cancellation axis 1108.

The method involves simply selecting a D value and crossover frequency and then calculating X. If X satisfies the "~1/10 rule" ($L \geq \sim(2X)/10$) then D and the crossover frequency have been properly selected for that particular application. An example of how to apply the method will be discussed with reference to the first entry in Table of FIG. 11. Here a D value of 21" and crossover frequency of 4500 Hz has been selected. Next, the $\lambda$ is determined to be 3" based on the frequency of 4500 Hz. It is known that $F=2D^2/\lambda$ so that F is determined to be 24.5 feet (24.5°). Number of lobes=$2D/\lambda+1=15$. The angle "a" is calculated as "a" ~ $(180/\# \text{lobes}) \times \frac{1}{2}$=about 5.5 degrees (more forward lobes are narrower). Next, X is calculated as $(F)\sin(a)=24.5" \times 12"/\text{ft.} \times \sin e(5.5)=28.2"$. Finally for the "~1/10 rule" to be satisfied, $\frac{1}{10}(2X)<L$. For this example, $\frac{1}{10}(2\times28.2)=5.64"<7"$ so that the rule is satisfied. This means a distance D of 21" between drivers and a crossover frequency of 4500 Hz would be a good design particularly in a room where the audience is approximately at the far field line of 24.5° and beyond to ~7/5.64×24.5°=~30'(+) ensuring one ear of a person within the far field always experiences good audio; listeners closer to the speaker also have reasonable uniformity of sound levels being in the near and mid fields as per FIG. 8, but with somewhat less of the dynamic 'sound-in-motion' effect.

For analogous results in larger rooms/venues, greater number of lobes are required, by adjustments of the D &/or crossover frequency.

Figure 15:
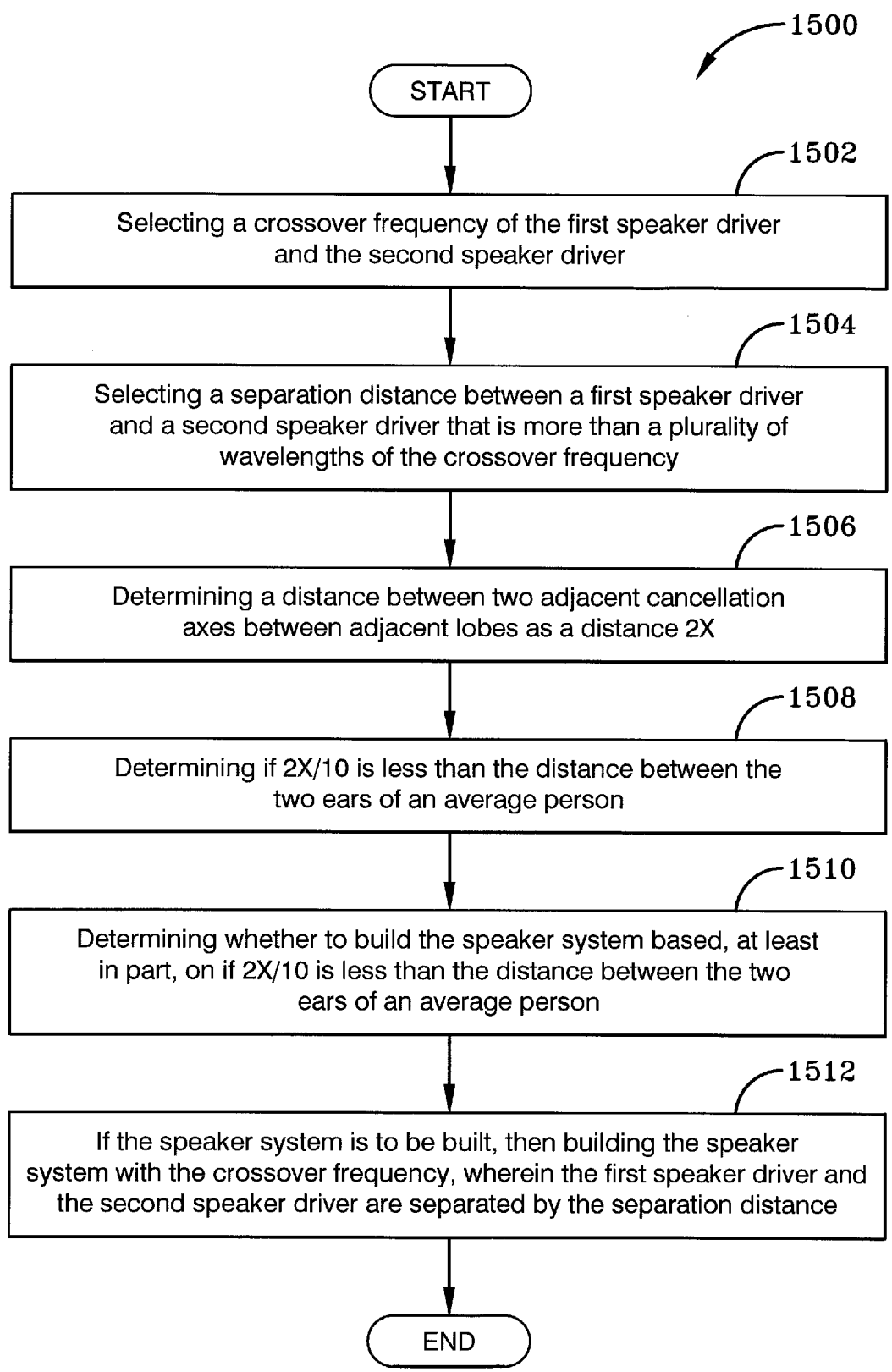
FIG. 15 illustrates the preferred embodiment configured as a method for locating speaker drivers and building a speaker system.

FIG. 15 illustrates a configuration of the preferred embodiment configured as a method 1500 of locating speaker drivers and building a speaker system. The method 1500 begins by selecting a crossover frequency of a first speaker driver and a second speaker driver, at 1502. Next, a separation distance between the first speaker driver and the second speaker driver that is more than a plurality of wavelengths of the crossover frequency is selected, at 1504. At 1506, a distance between two adjacent cancellation axes that are between adjacent lobes is determined as a distance 2X. Next, a determination is made, at 1508, if (2X)/10 is less than the distance between the two ears of an average person. A determination is made, at 1510, to determine whether to build the speaker system based, at least in part, on if (2X)/10 is less than the distance between the two ears of an average person. If the speaker system is to be built, then the method builds the speaker system, at 1512. The speaker system is built with the crossover frequency and the first speaker driver and the second speaker driver separated by the separation distance.

In the foregoing description, certain terms have been used for brevity, clearness, and understanding. No unnecessary limitations are to be implied therefrom beyond the requirement of the prior art because such terms are used for descriptive purposes and are intended to be broadly construed. Therefore, the invention is not limited to the specific details, the representative embodiments, and illustrative examples shown and described. Thus, this application is intended to embrace alterations, modifications, and variations that fall within the scope of the appended claims.

Moreover, the description and illustration of the invention is an example and the invention is not limited to the exact details shown or described. References to "the preferred embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in the preferred embodiment" does not necessarily refer to the same embodiment, though it may.

What is claimed is:

1. An audio system comprising:
a first speaker is configured to reproduce sounds in a first frequency range; and
a second speaker configured to reproduce sounds in second frequency range, wherein a crossover frequency is at an overlap of the first frequency range and the second frequency range, wherein the first speaker and the second speaker are physically separated by more than one wavelength of the crossover frequency, and wherein the first speaker is arranged horizontal with respect to the second speaker,
wherein the first sound source driver and the second sound source driver are configured to generate a radiation lobe pattern so that a person within a far field and facing the first sound source driver and the second sound source driver always has one ear within a lobe of the radiation lobe pattern, wherein the far field begins at a distance from the first sound source driver and the second sound source driver defined by $2D^2$/crossover frequency wavelength, where D is a distance between the first sound source driver and the second sound source driver.

2. The audio system of claim 1 wherein the first speaker and the second speaker are separated by more than two wavelengths of the crossover frequency.

3. The audio system of claim 1 wherein the first speaker is a woofer speaker and the second speaker is a tweeter speaker.

4. The audio system of claim 1 wherein the first speaker and the second speaker are configured to generate more than five far field lobes.

5. The audio system of claim 4 wherein the far field lobes are fin-type lobes created left-to-right when viewed from above the audio system with similarity in azimuth pattern forms at all elevations.

6. The audio system of claim 4 wherein the first speaker and the second speaker are non-coherent sources.

7. The audio system of claim 1 wherein the first speaker and the second speaker are separated by more than five wavelengths of the crossover frequency.

8. The audio system of claim 1 further comprising: a housing with the first speaker and the second speaker mounted in the housing.

9. The audio system of claim 1 wherein both ears of a human are located at sound pressure level spots at and near crossover points in both a near field and a mid field where the near field and the mid field do not extend beyond a distance of $2D^2$/crossover frequency wavelength, where D is a distance between the first speaker and the second speaker.

10. The audio system of claim 1 wherein when a frequency produced by both speakers is followed by a higher or lower frequency also produced by both speakers, there is a change in fin-shaped wave summation lobes such that a relative difference of audio levels are experienced in one ear of a human, and wherein this change of the fin-shaped summation lobes is a directional sensed shift that creates a 'dynamic sound stage'.

11. A sound system comprising
a first sound source driver; and
a second sound source driver, wherein there is a crossover frequency output by both the first sound source driver and by the second sound source driver due to overlap of the frequency ranges produced by the two drivers, wherein the first sound source driver and the second sound source driver are located greater than one wavelength value apart,
wherein the first sound source driver and the second sound source driver are configured to generate a radiation lobe pattern so that a person within the far field and facing the first sound source driver and the second sound source driver always has one ear within a lobe of the radiation lobe pattern, wherein a far field begins at a distance from the first sound source driver and the second sound source driver defined by $2D^2$/crossover frequency wavelength, where D is a distance between the first sound source driver and the second sound source driver.

12. The sound system of claim 11 wherein the first sound source driver and the second sound source driver are horizontally spaced with respect to each other.

13. A speaker system comprising:
a first audio driver configured to generate a first frequency range;
a second audio driver configured to generate a second frequency range with a crossover frequency produced by both the first audio driver and the second audio driver,
wherein the first audio driver and second audio driver are separated by a separation distance that is more than a plurality of wavelengths of the crossover frequency;
wherein when the audio system is in operation a distance between two adjacent cancellation axes between adjacent lobes has a distance 2X, and
wherein when the audio system is in operation the value of 2X/10 is equal to or less than the distance between the two ears of an average person, and
wherein the first sound source driver and the second sound source driver are configured to generate a radiation lobe pattern so that a person within the far field and facing the first sound source driver and the second sound source driver always has one ear within a lobe of the radiation lobe pattern, wherein a far field begins at a distance from the first sound source driver and the second sound source driver defined by $2D^2$/crossover frequency wavelength, where D is a distance between the first sound source driver and the second sound source driver.

14. The speaker system claim 13 wherein the first audio driver is a tweeter and the second audio driver is a woofer.

15. The speaker system of claim 13 wherein when the audio system is in operation the value of 2X/10 is equal to or less than the distance between the two ears of an average person when the person is within the far field area.

16. The speaker system of claim 13 further wherein when the speaker system is in operation and one ear of a person facing the speaker system is in a cancellation axis, then the person's other ear is always with in a lobe to receive audio.

17. The speaker system of claim 13 wherein the first audio driver and the second audio driver are in a horizontal arrangement.

18. The speaker system of claim 13 wherein the first audio driver and the second audio driver are non-coherent sources.

* * * * *